(12) United States Patent
Xiao et al.

(10) Patent No.: US 11,557,145 B2
(45) Date of Patent: Jan. 17, 2023

(54) PHOTO SENSOR HAVING A PHOTOSENSITIVE LAYER MADE OF INTRINSIC AMORPHOUS SILICON, MANUFACTURING METHOD THEREOF, AND DISPLAY PANEL HAVING THE SAME

(71) Applicant: WUHAN CHINA STAR OPTOELECTRONICS TECHNOLOGY CO., LTD., Hubei (CN)

(72) Inventors: Juncheng Xiao, Hubei (CN); Fei Ai, Hubei (CN); Jiyue Song, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 229 days.

(21) Appl. No.: 16/956,962

(22) PCT Filed: Apr. 2, 2020

(86) PCT No.: PCT/CN2020/083006
§ 371 (c)(1),
(2) Date: Jun. 22, 2020

(87) PCT Pub. No.: WO2021/184430
PCT Pub. Date: Sep. 23, 2021

(65) Prior Publication Data
US 2022/0122370 A1    Apr. 21, 2022

(30) Foreign Application Priority Data

Mar. 18, 2020  (CN) .......................... 202010190030.9

(51) Int. Cl.
*G06V 40/13*    (2022.01)
*H01L 27/146*    (2006.01)

(52) U.S. Cl.
CPC ...... *G06V 40/1318* (2022.01); *H01L 27/1461* (2013.01); *H01L 27/14623* (2013.01);
(Continued)

(58) Field of Classification Search
CPC ........... H01L 27/1461; H01L 27/14623; H01L 27/14678; H01L 27/14685;
(Continued)

(56) References Cited

U.S. PATENT DOCUMENTS 6,593,635 B2   7/2003 Yanagisawa
2009/0141224 A1  6/2009 Ito et al.
(Continued)

FOREIGN PATENT DOCUMENTS

CN    1894798 A    1/2007
CN    101162741 A   4/2008
(Continued)

*Primary Examiner* — Nelson Garces

(57) ABSTRACT

A photo sensor, a manufacturing method thereof, and a display panel are disclosed. By an ion implantation method forming an N-type region and a P-type region on a surface of polycrystalline silicon in a same layer respectively, compatibility with an ion implantation process is ensured, while covering a layer of an amorphous silicon photosensitive layer on the polycrystalline silicon enhances light absorption ability and can increase photo-generated electron-hole pairs. Furthermore, built-in electric fields exist on a horizontal direction and a vertical direction, which can more effectively separate the electron-hole pairs to enhance photo-generated electric current to improve accuracy of fingerprint recognition.

13 Claims, 7 Drawing Sheets

(52) U.S. Cl.
CPC .. *H01L 27/14678* (2013.01); *H01L 27/14685* (2013.01); *H01L 27/14692* (2013.01)

(58) Field of Classification Search
CPC ............. H01L 27/14692; H01L 29/868; H01L 31/028; H01L 31/105; H01L 31/1055; H01L 33/0012; G06V 40/1318; G06V 40/13

See application file for complete search history.

(56) References Cited

U.S. PATENT DOCUMENTS

| | | | |
|---|---|---|---|
| 2009/0162961 A1 | 6/2009 | Deane | |
| 2011/0194036 A1* | 8/2011 | Okajima | G02F 1/13318 349/1 |
| 2013/0099290 A1* | 4/2013 | Itoh | H01L 27/1214 257/225 |
| 2013/0120760 A1 | 5/2013 | Raguin | |
| 2015/0108327 A1* | 4/2015 | Huang | H01L 31/03529 257/438 |
| 2017/0184887 A1* | 6/2017 | Xiao | H01L 29/78621 |
| 2020/0022601 A1* | 1/2020 | Rogers | A61B 5/283 |
| 2022/0085310 A1* | 3/2022 | Guo | H01L 31/1055 |

FOREIGN PATENT DOCUMENTS

| | | |
|---|---|---|
| CN | 101447523 A | 6/2009 |
| CN | 101577285 A | 11/2009 |
| CN | 105097666 A | 11/2015 |
| CN | 105655410 A | 6/2016 |
| CN | 106684202 A | 5/2017 |
| CN | 107481936 A | 12/2017 |
| CN | 108538860 A | 9/2018 |
| CN | 109359640 A | 2/2019 |
| CN | 109727968 A | 5/2019 |
| CN | 110007536 A | 7/2019 |
| CN | 110458036 A | 11/2019 |

* cited by examiner

PHOTO SENSOR HAVING A PHOTOSENSITIVE LAYER MADE OF INTRINSIC AMORPHOUS SILICON, MANUFACTURING METHOD THEREOF, AND DISPLAY PANEL HAVING THE SAME

FIELD OF INVENTION

The present disclosure relates to the field of semiconductor technology, and particularly relates to a photo sensor, a manufacturing method thereof, and a display panel.

BACKGROUND OF INVENTION

Fingerprints are invariable features that are inherently unique to each individual and can be distinguished from others. Fingerprint patterns have uniqueness, and they are formed by a series of ridges and valleys on skin surfaces of finger ends. Fingerprint recognition technology developed from fingerprints is a technology used earlier for personal identity verification. Currently, the fingerprint recognition technology is widely used in panels with medium and small dimensions, wherein there are mainly several types of such technology such as a capacitive type, an ultrasonic wave type, an optical type, etc. Compared to the capacitive type fingerprint recognition technology and the ultrasonic wave type fingerprint recognition technology, the optical fingerprint recognition has good stability, strong anti-static ability, good transmission ability, as well as low cost. The fingerprint recognition technology uses a principle of refraction and reflection of light. When light irradiates on fingers, it is reflected by the fingers and is received by a photo sensor. The photo sensor can convert light signal into an electricity signal for reading. Because light reflections on valleys and ridges of the fingerprints are different, intensity of reflected light from the valleys and the ridges received by the photo sensor are different, and a converted electric current or voltage is different. Hence, special points of the fingerprints can be caught to provide unique confirmation information.

Regarding to the optical fingerprint recognition technology, the photo sensor is a key module which can realize conversion of light signals into electrical signals that can be read directly. Traditional photo sensor structures are vertical PIN-type photoelectric diodes of an amorphous silicon (a-Si) material. A layer of I-type semiconductor with a low concentration is doped in a middle of a PN junction of the photoelectric diode. Because the doping concentration of the doping layer is as low as an intrinsic semiconductor, the doping layer is Known as an I-type region. Therefore, this structure becomes the PIN-type photoelectric diodes. A majority of incident light is absorbed in the I-type region, and a large number of electron-hole pairs are generated. Meanwhile, a proportion of incident light absorbed by a P-type region and an N-type region is quite small. The I-type region is a high resistance region compared to the P-type region and the N-type region, so a built-in electric field of the PN junction basically all concentrates in the I-type region.

A current manufacturing method of PIN-type photoelectric diodes are adding phosphane and borane during a chemical vapor deposition (CVD) film formation process to realize N-type regions and P-type regions to constitute the diodes. However, a current low-temperature polycrystalline-silicon (LTPS) production line process for realizing transformation of the N-types or the P-types of the semiconductors is performed by methods of ion implantation and high-temperature activation. Therefore, the current manufacturing method of the PIN-type photoelectric diodes is incompatible with the current LTPS production line process. Regarding the LTPS process, because a crystallization thickness of polycrystalline silicon (Poly-Si) is limited by an excimer laser annealing (ELA) process, PIN-type diode devices of full Poly-Si horizontal structures manufactured by using the ion implantation process have relatively low optoelectronic response, thereby making integrated circuits (ICs) unable to read signals accurately, and affecting accuracy of fingerprint recognition.

Therefore, how to ensure compatibility with the ion implantation process of the LTPS production line and while realizing strong light absorption ability have become technical problems in development of optical fingerprint recognition technology which need to be solved.

SUMMARY OF INVENTION

The present disclosure addresses the technical problem of the prior art to provide a photo sensor, a manufacturing method thereof, and a display panel, which can be compatible with the ion implantation process of the LTPS production line and also realizes strong light absorption ability.

In order to realize the purpose mentioned above, the present disclosure provides a manufacturing method of a photo sensor, including following steps: forming a first insulation layer on a base substrate; forming a polycrystalline silicon layer on the first insulation layer, and performing a patterning process on the polycrystalline silicon layer to form a first region, a second region, and a third region between the first region and the second region; using an ion implantation method to dope a plurality of first ions in the first region of the polycrystalline silicon layer to form a P-type region and to dope a plurality of second ions in the second region of the polycrystalline silicon layer to form an N-type region; forming a photosensitive layer on the polycrystalline silicon layer, wherein the photosensitive layer covers the third region and extends to the P-type region and the N-type region respectively, and the third region forms an I-type region; forming a second insulation layer on the photosensitive layer, and on the second insulation layer, forming a first connection hole in a region corresponding to the P-type region and forming a second connection hole in a region corresponding to the N-type region; and forming an electrode layer on the second insulation layer, wherein the electrode layer includes a first electrode and a second electrode, the first electrode is connected to the P-type region through the first connection hole, and the second electrode is connected to the N-type region through the second connection hole.

In order to realize the purpose mentioned above, the present disclosure further provides a photo sensor, including: a first insulation layer disposed on a base substrate; a semiconductor layer, wherein the semiconductor layer includes a P-type region, an I-type region, and an N-type region sequentially disposed on the first insulation layer along a transverse direction; a photosensitive layer covering the I-type region and extending to the P-type region and the N-type region respectively; a second insulation layer covering the photosensitive layer, wherein the second insulation layer includes a first connection hole in a region corresponding to the P-type region and a second connection hole in a region corresponding to the N-type region; and an electrode layer disposed on the second insulation layer, wherein the electrode layer comprises a first electrode and a second electrode, the first electrode is connected to the P-type region through the first connection hole, and the second electrode is connected to the N-type region through the second connection hole.

In order to realize the purpose mentioned above, the present disclosure further provides a display panel. The display panel includes an array substrate. The array substrate includes: a base substrate; a thin film transistor layer disposed on the base substrate; and at least one photo sensor disposed on the base substrate. Furthermore, the photo sensor mentioned above in the present disclosure is used as the photo sensor.

The present disclosure respectively implants phosphorus ions to form an N-type region and implants boron ions to form a P-type region on a surface of a same layer of polycrystalline silicon by an ion implantation method, which is compatible with an ion implantation process and does not need to add borane gas and phosphane gas; and covers a layer of an amorphous silicon photosensitive layer on the polycrystalline silicon, which enhances light absorption ability and can increase photo-generated electron-hole pairs. Furthermore, built-in electric fields exist on a horizontal direction and a vertical direction, which can more effectively separate the electron-hole pairs to enhance photo-generated electric current to improve accuracy of fingerprint recognition. The PIN-type diode photo sensor of the present disclosure can be used in liquid crystal display (LCD) panels or under organic light emitting diode (OLED) panels to perform optical fingerprint recognition.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
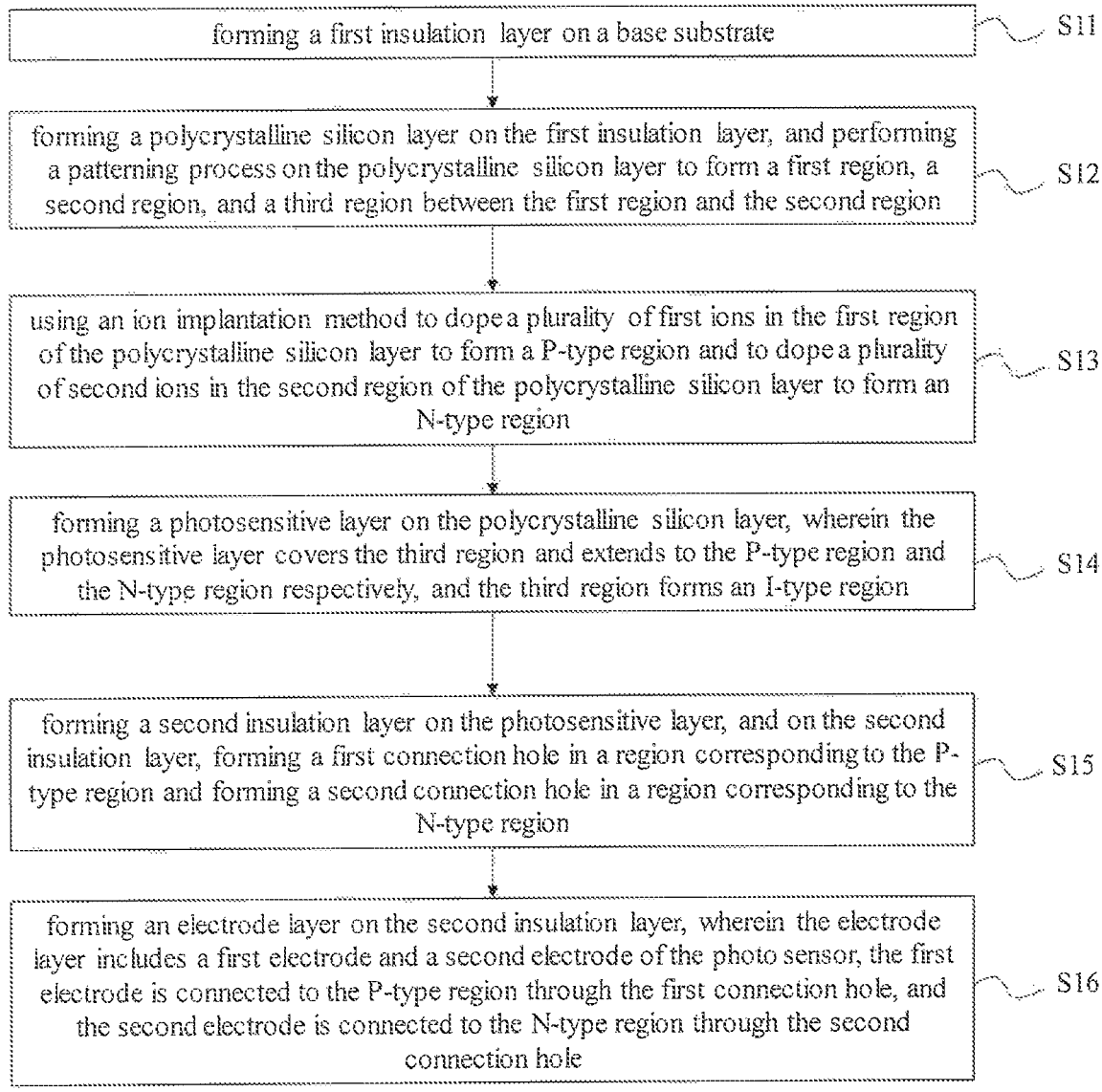
FIG. 1 is a flowchart of a manufacturing method of a photo sensor of the present disclosure.

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front" "rear", "left", "right", "vertical", "horizontal", "top", "bottom", "inside", "outside", "clockwise", "counterclockwise" etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature.

The following disclosure provides many different embodiments or examples for implementing the different structures of the present disclosure. In order to simplify the disclosure of the present disclosure, the components and configurations of the specific examples are described below, Of course, they are merely examples and are not intended to limit the present disclosure. In addition, the present disclosure may repeat reference numerals and/or reference numerals in different examples, which are for the purpose of simplicity and clarity, and do not indicate the relationship between the various embodiments and/or arrangements discussed. Moreover, the present disclosure provides embodiments of various specific processes and materials, but one of ordinary skill in the art will recognize the use of other processes and/or the use of other materials.

The present disclosure provides a design of a photo sensor, which respectively implants phosphorus ions to form an N-type region and implants boron ions to form a P-type region on a surface of a same layer of polycrystalline silicon by an ion implantation method, which is compatible with an ion implantation process and does not need to add borane gas and phosphane gas; and covers a layer of an amorphous silicon photosensitive layer on the polycrystalline silicon, which enhances light absorption ability and can increase photo-generated electron-hole pairs. Furthermore, built-in electric fields exist on a horizontal direction and a vertical direction, which can more effectively separate the electron-hole pairs to enhance photo-generated electric current to improve accuracy of fingerprint recognition. A photo sensor of the present disclosure can be used in liquid crystal display (LCD) panels or under organic light emitting diode (OLED) panels to perform optical fingerprint recognition.

Please refer to FIG. 1 and FIG. 2A to FIG. 2F, wherein FIG. 1 is a flowchart of a manufacturing method of a photo sensor of the present disclosure, and FIG. 2A to FIG. 2F are operation process charts of a first embodiment of the manufacturing method of the photo sensor of the present disclosure.

As illustrated in FIG. 1, the manufacturing method includes following steps: S11: forming a first insulation layer on a base substrate; S12: forming a polycrystalline silicon layer on the first insulation layer, and performing a patterning process on the polycrystalline silicon layer to form a first region, a second region, and a third region between the first region and the second region; S13: using an ion implantation method to dope a plurality of first ions in the first region of the polycrystalline silicon layer to form a P-type region and to dope a plurality of second ions in the second region of the polycrystalline silicon layer to form an N-type region; S14: forming a photosensitive layer on the polycrystalline silicon layer, wherein the photosensitive layer covers the third region and extends to the P-type region and the N-type region respectively, and the third region forms an I-type region; S15: forming a second insulation layer on the photosensitive layer, and on the second insulation layer, forming a first connection hole in a region corresponding to the P-type region and forming a second connection hole in a region corresponding to the N-type region; and S16: forming an electrode layer on the second insulation layer, wherein the electrode layer includes a first electrode and a second electrode of the photo sensor, the first electrode is connected to the P-type region through the first connection hole, and the second electrode is connected to the N-type region through the second connection hole. The following will be described in detail with reference to the drawings.

Figure 2A:
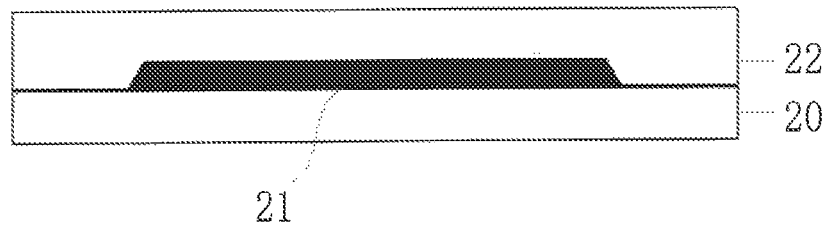
FIG. 2A to FIG. 2F are operation process charts of a first embodiment of the manufacturing method of the photo sensor of the present disclosure.

About the step S11: forming the first insulation layer on the base substrate, please refer to FIG. 1 and FIG. 2A. As illustrated in FIG. 2A, the first insulation layer includes a light shielding (LS) layer 21 and a buffer layer 22. Specifically, a non-light-transmissive material can be deposited on the base substrate 20. Afterwards, methods such as exposure, etching, etc. can be used to pattern the material to form the light shielding (LS) layer 21. The light shielding layer 21 partially covers the base substrate 20. Then, the buffer layer 22 is formed on the light shielding layer 21, and the formed buffer layer 22 covers the light shielding layer 21 and the base substrate 20. The base substrate 20 can be a glass substrate or other hard substrate.

In a further embodiment, the light shielding layer 21 is a single-layer structure or a laminated structure made of a non-light-transmissive material. The non-light-transmissive material can be Mo, Ti, a Mo/Al laminated layer, a Ti/Al laminated layer, etc.

In a further embodiment, silica (SiOx), silicon nitride (SiNx), or silicon oxynitride (SiOxNy) can be used as a material of the buffer layer 22, and a SiOx/SiNx laminated structure can also be used.

Figure 2B:
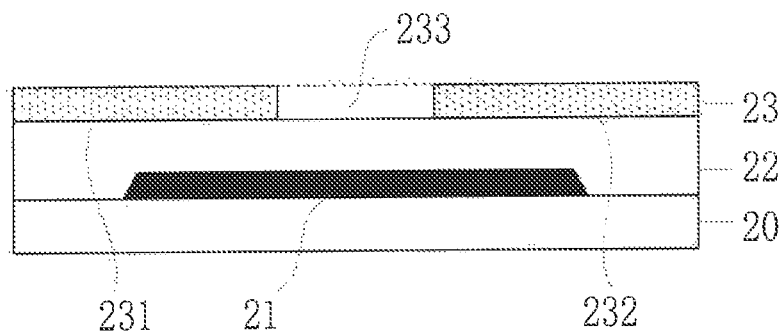

About the step S12: forming the polycrystalline silicon layer on the first insulation layer, and performing the patterning process on the polycrystalline silicon layer to form the first region, the second region, and the third region between the first region and the second region, please refer to FIG. 1 and FIG. 2B. As illustrated in FIG. 2B, a polycrystalline silicon (Poly-Si) material is deposited on the buffer layer 22 to form the polycrystalline silicon (Poly-Si) layer 23. By performing the patterning process on the polycrystalline silicon (Poly-Si) layer 23, the first region 231 and the second region 232 can be formed, and the third region 233 between the first region 231 and the second region 232 is etched to form a blank region (boundary of the third region 233 is indicated by dotted lines).

Figure 2C:
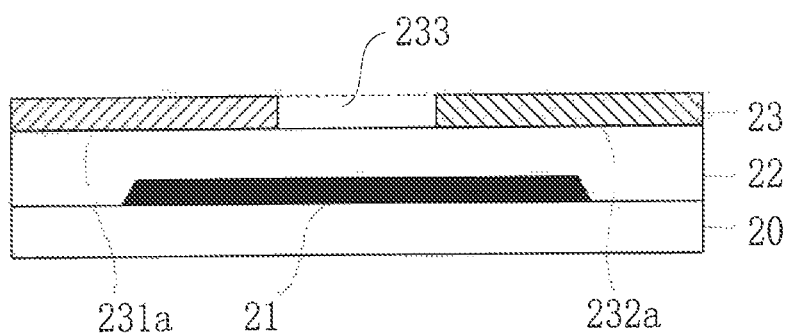

About the step S13: using the ion implantation method to dope of the plurality of first ions in the first region of the polycrystalline silicon layer to form the P-type region and to dope the plurality of second ions in the second region of the polycrystalline silicon layer to form the N-type region, please refer to FIG. 1 and FIG. 2C. As illustrated in FIG. 2C, by using the method of ion implantation, intrinsic polycrystalline silicon of the same layer is changed into P-type polycrystalline silicon and N-type polycrystalline silicon to form the P-type region 231a and the N-type region 232a respectively, which can be compatible with an ion implantation process of a current LTPS production line process and does not need to add borane and phosphane to manufacture different layers.

In a further embodiment, ion implantation of first ions and second ions are performed by two photomask processes respectively. Specifically, a first photomask is used to cover the polycrystalline silicon layer 23 and to expose the first region 231, and the doping of the first ions is performed on the first region 231 of the polycrystalline silicon layer 23 to form the P-type region 231a. The first ions can be boron ions or indium ions. A second photomask is used to cover the polycrystalline silicon layer 23 and to expose the second region 232, and the doping of the second ions is performed on the second region 232 of the polycrystalline silicon layer 23 to form the N-type region 232a. The second ions can be phosphorus ions or antimony ions.

Figure 2D:
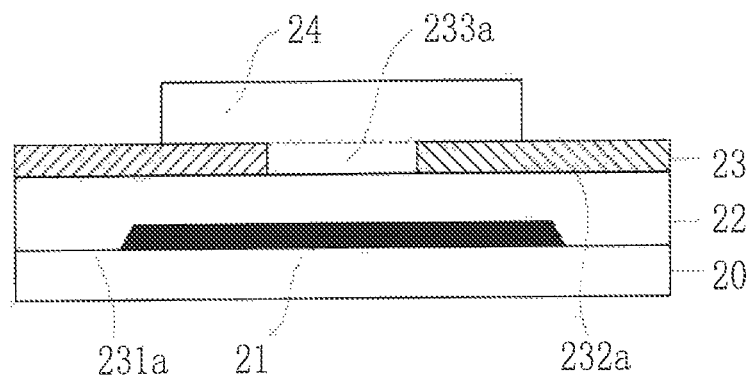

About the step S14: forming the photosensitive layer on the polycrystalline silicon layer, wherein the photosensitive layer covers the third region and extends to the P-type region and the N-type region respectively, and the third region forms an I-type region, please refer to FIG. 1 and FIG. 2D. As illustrated in FIG. 2D, by covering a layer of a light absorption material on the polycrystalline silicon layer 23 to act as the photosensitive layer 24, the photosensitive layer 24 completely covers the third region 233 and extends to the P-type region 231a and the N-type region 232a respectively, that is, at least part of the P-type region 231a and at least part of the N-type region 232a are covered by the photosensitive layer 24. Because the third region 233 is the blank region, a material forming the photosensitive layer 24 further fills the third region 233 to form the I-type region 233a from the third region 233.

In a further embodiment, a material of the photosensitive layer 24 is intrinsic amorphous silicon (a-Si), and a layer thickness of the photosensitive layer 24 is greater than or equal to 2000 angstroms, which can ensure sufficient absorption of reflected light from fingers and increases photo-generated electron-hole pairs. Furthermore, by covering a layer of the intrinsic a-Si photosensitive layer on the PIN-type diodes of a horizontal structure, after light is received, built-in electric fields exist on a horizontal direction and a vertical direction, which can more effectively separate the electron-hole pairs to enhance photo-generated electric current and to improve accuracy of fingerprint recognition.

Figure 2E:
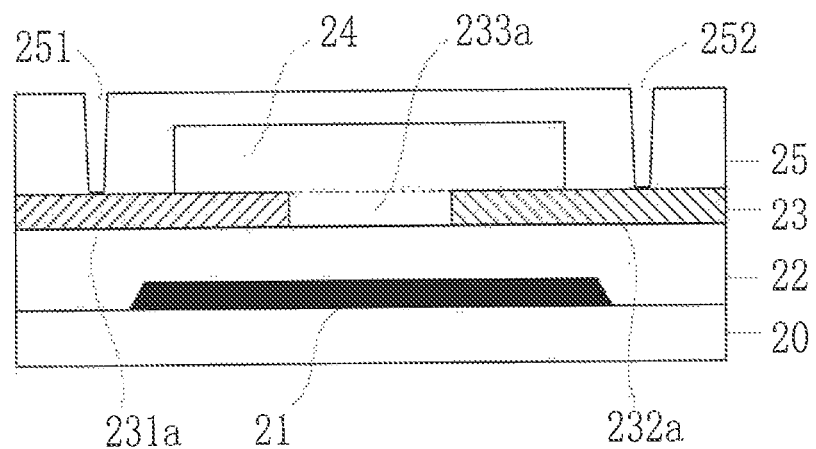

About the step S15: forming the second insulation layer on the photosensitive layer, and on the second insulation layer, forming the first connection hole in the region corresponding to the P-type region and forming the second connection hole in the region corresponding to the N-type region, please refer to FIG. 1 and FIG. 2E.

As illustrated in FIG. 2E, an insulation material can be deposited on the photosensitive layer 24 to perform hydrogenation activation to form the second insulation layer 25. Afterward, methods such as exposure, etching, etc. are used to pattern it to form the first connection hole 251 and the second connection hole 252.

Furthermore, the first connection hole 251 corresponds to the P-type region 231a, and the second connection hole 252 corresponds to the N-type region 232a.

In a further embodiment, SiOx, SiNx, or SiOxNy can be used as a material of the second insulation layer 25, and a SiOx/SiNx laminated structure can also be used.

Figure 2F:
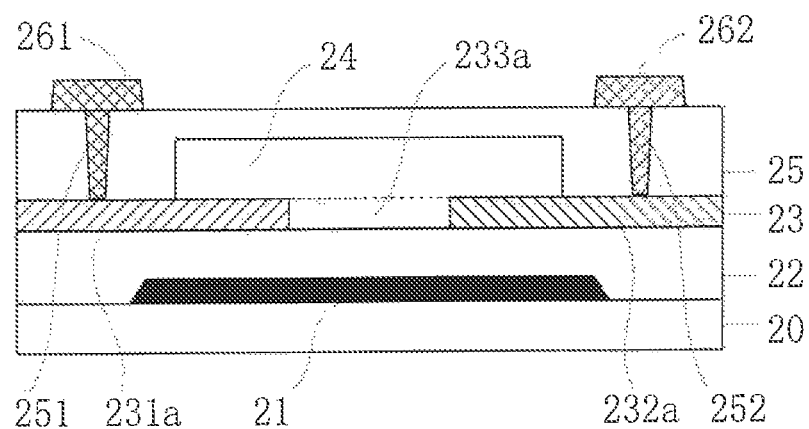

About the step S16: forming the electrode layer on the second insulation layer, wherein the electrode layer includes the first electrode and the second electrode, the first electrode is connected to the P-type region through the first connection hole, and the second electrode is connected to the N-type region through the second connection hole, please refer to FIG. 1 and FIG. 2F. As illustrated in FIG. 2F, an electrode material is deposited on the second insulation layer 25 corresponding to locations of the first connection hole 251 and the second connection hole 252 to form the electrode layer, and the patterning process is performed to respectively form the first electrode 261 and the second electrode 262 of the photo sensor, which make the first electrode 261 be connected to the P-type region 231a through the first connection hole 251 and the second electrode 262 be connected to the N-type region 232a through the second connection hole 252.

In a further embodiment, materials of the first electrode 261 and the second electrode 262 can be singular metal layers or laminated metal layers with good conductivity such as Ag, Cu, Al, Mo/Al/Mo laminate layers, Ti/Al/Ti laminate layers, or Mo/Cu laminate layers, etc.

The manufacturing method of the photo sensor of this embodiment, through respectively implanting phosphorus ions to form an N-type region and implanting boron ions to form a P-type region on a surface of a same layer of polycrystalline silicon by an ion implantation method, is compatible with an ion implantation process and does not need to add borane gas and phosphene gas. Furthermore, covering a layer of an amorphous silicon photosensitive layer on the polycrystalline silicon enhances light absorption ability and can increase photo-generated electron-hole pairs. Furthermore, built-in electric fields exist on a horizontal direction and a vertical direction, which can more effectively separate the electron-hole pairs to enhance photo-generated electric current to improve accuracy of fingerprint recognition.

Please refer to FIG. 1 and FIG. 3A to FIG. 3F, wherein FIG. 3A to FIG. 3F are operation process charts of a second embodiment of the manufacturing method of the photo sensor of the present disclosure.

Figure 3A:
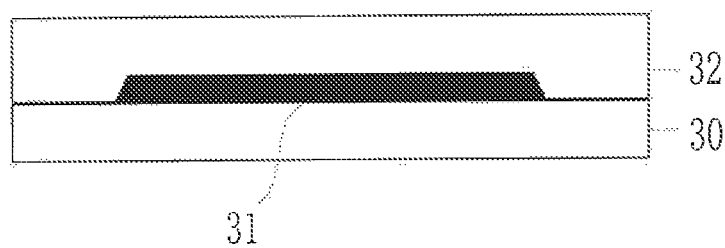
FIG. 3A to FIG. 3F are operation process charts of a second embodiment of the manufacturing method of the photo sensor of the present disclosure.

About the step S11: forming the first insulation layer on the base substrate, please refer to FIG. 1 and FIG. 3A, As illustrated in FIG. 3A, the first insulation layer includes a light shielding (LS) layer 31 and a buffer layer 32. Specifically, a non-light-transmissive material can be deposited on the base substrate 30. Afterwards, methods such as exposure, etching, etc. can be used to pattern the material to form the light shielding (LS) layer 31. The light shielding layer 31 partially covers the base substrate 30. Then, the buffer layer 32 is formed on the light shielding layer 31, and the formed buffer layer 32 covers the light shielding layer 31 and the base substrate 30.

In a further embodiment, the light shielding layer 31 is a single-layer structure or a laminated structure made of a non-light-transmissive material. The non-light-transmissive material can be Mo, Ti, a Mo/Al laminated layer, a Ti/Al laminated layer, etc.

In a further embodiment, SiOx, SiNx, or SiOxNy can be used as a material of the buffer layer 32, and a SiOx/SiNx laminated structure can also be used.

Figure 3B:
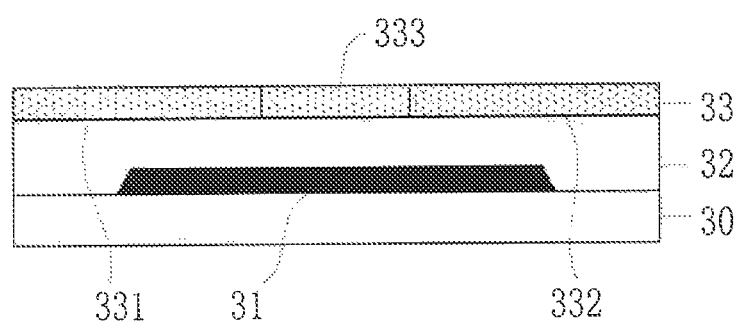

About the step S12: forming the polycrystalline silicon layer on the first insulation layer, and performing the patterning process on the polycrystalline silicon layer to form the first region, the second region, and the third region between the first region and the second region, please refer to FIG. 1 and FIG. 3B. As illustrated in FIG. 3B, a polycrystalline silicon (Poly-Si) material is deposited on the buffer layer 32 to form the polycrystalline silicon (Poly-Si) layer 33. By performing the patterning process on the polycrystalline silicon (Poly-Si) layer 33, the first region 331, the second region 332, and the third region 333 between the first region 331 and the second region 332 can be formed. That is, the polycrystalline silicon between the first region 331 and the second region 332 is reserved, the formed third region 333 is a polycrystalline silicon region, and the polycrystalline silicon region acts as an I-type region of the PIN-type diode.

Figure 3C:
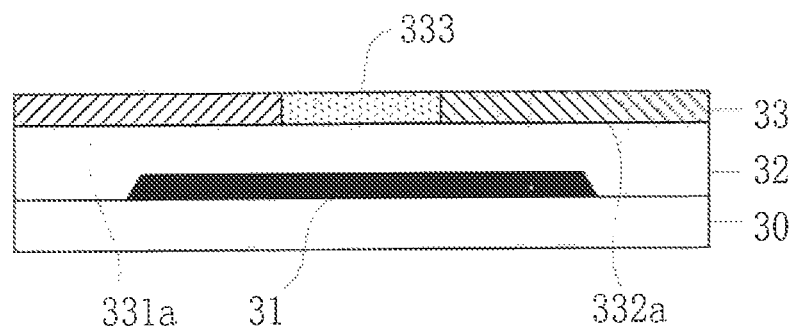

About the step S13: using the ion implantation method to dope the plurality of first ions in the first region of the polycrystalline silicon layer to form the P-type region and to dope the plurality of second ions in the second region of the polycrystalline silicon layer to form the N-type region, please refer to FIG. 1 and FIG. 3C. As illustrated in FIG. 3C, by using the method of ion implantation, intrinsic polycrystalline silicon of the same layer is changed into P-type polycrystalline silicon and N-type polycrystalline silicon to form the P-type region 331a and the N-type region 332a respectively, which can be compatible with an ion implantation process of a current LTPS production line process and does not need to add borane and phosphane to manufacture different layers.

In a further embodiment, ion implantation of first ions and second ions are performed by two photomask processes respectively. Specifically, a first photomask is used to cover the polycrystalline silicon layer 33 and to expose the first region 331, and the doping of the first ions is performed on the first region 331 of the polycrystalline silicon layer 33 to form the P-type region 331a. The first ions can be boron ions or indium ions. A second photomask is used to cover the polycrystalline silicon layer 33 and to expose the second region 332, and the doping of the second ions is performed on the second region 332 of the polycrystalline silicon layer 33 to form the N-type region 332a. The second ions can be phosphorus ions or antimony ions.

Figure 3D:
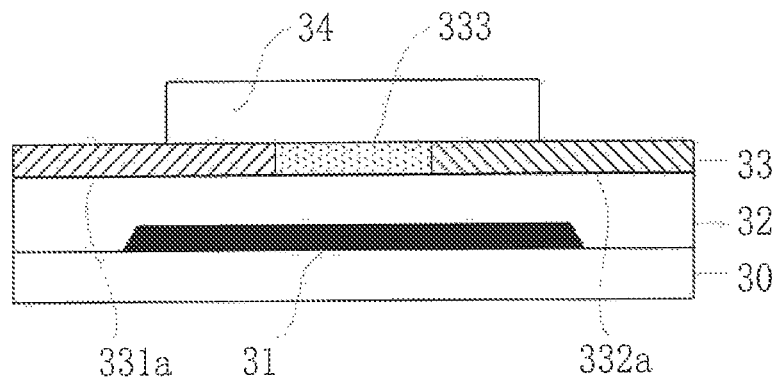

About the step S14: forming the photosensitive layer on the polycrystalline silicon layer, wherein the photosensitive layer covers the third region and extends to the P-type region and the N-type region respectively, and the third region forms an I-type region, please refer to FIG. 1 and FIG. 3D. As illustrated in FIG. 3D, by covering a layer of a light absorption material on the polycrystalline silicon layer 33 to act as the photosensitive layer 34, the photosensitive layer 34 completely covers the third region 333 and extends to the P-type region 331a and the N-type region 332a respectively, that is, at least part of the P-type region 331a and at least part of the N-type region 332a are covered by the photosensitive layer 34.

In a further embodiment, a material of the photosensitive layer 34 is intrinsic amorphous silicon (a-Si), and a layer thickness of the photosensitive layer 34 is greater than or equal to 2000 angstroms, which can ensure sufficient absorption of reflected light from fingers and increases photo-generated electron-hole pairs. Furthermore, by covering a layer of the intrinsic a-Si photosensitive layer on the PIN-type diodes of a horizontal structure, after light is received, built-in electric fields exist on a horizontal direction and a vertical direction, which can more effectively separate the electron-hole pairs to enhance photo-generated electric current to improve accuracy of fingerprint recognition.

Figure 3E:
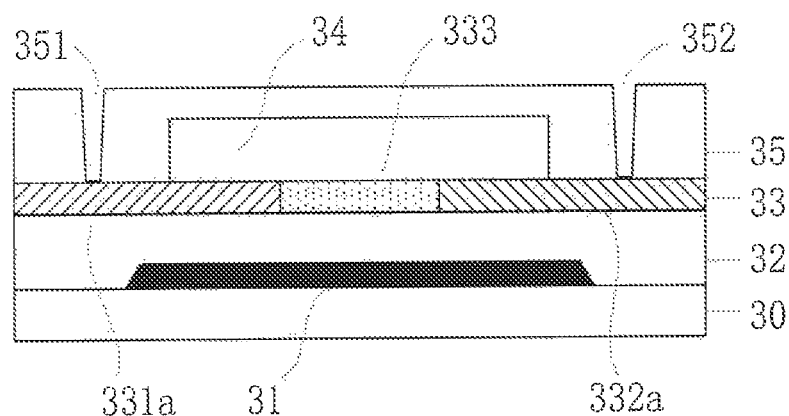

About the step S15: forming the second insulation layer on the photosensitive layer, and on the second insulation layer, forming the first connection hole in the region corresponding to the P-type region and forming the second connection hole in the region corresponding to the N-type region, please refer to FIG. 1 and FIG. 3E. As illustrated in FIG. 3E, an insulation material can be deposited on the photosensitive layer 34 to perform hydrogenation activation to form the second insulation layer 35. Afterward, methods such as exposure, etching, etc. are used to pattern it to form the first connection hole 351 and the second connection hole 352. Furthermore, the first connection hole 351 corresponds to the P-type region 331a, and the second connection hole 352 corresponds to the N-type region 332a.

In a further embodiment, SiOx, SiNx, or SiOxNy can be used as a material of the second insulation layer 35, and a SiOx/SiNx laminated structure can also be used.

Figure 3F:
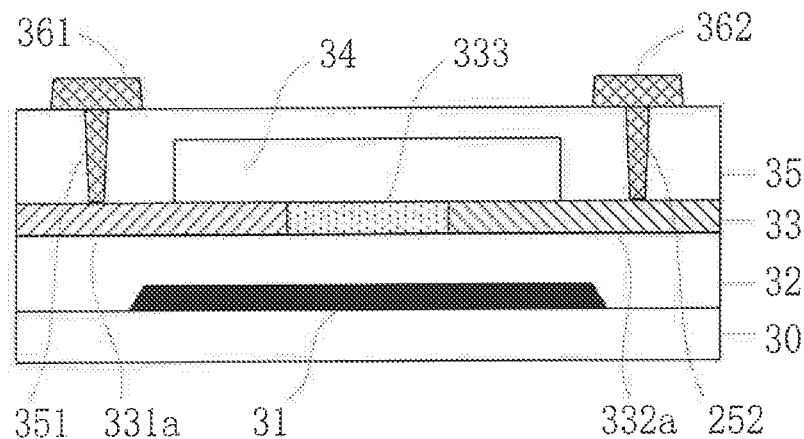

About the step S16: forming the electrode layer on the second insulation layer, wherein the electrode layer includes the first electrode and the second electrode, the first electrode is connected to the P-type region through the first connection hole, and the second electrode is connected to the N-type region through the second connection hole, please refer to FIG. 1 and FIG. 3F. As illustrated in FIG. 3F, an electrode material is deposited on the second insulation layer 35 corresponding to locations of the first connection hole 351 and the second connection hole 352 to form the electrode layer, and the patterning process is performed to respectively form the first electrode 361 and the second electrode 362 of the photo sensor, which make the first electrode 361 be connected to the P-type region 331a through the first connection hole 351 and the second electrode 362 be connected to the N-type region 332a through the second connection hole 352.

In a further embodiment, materials of the first electrode 361 and the second electrode 362 can be singular metal layers or laminated metal layers with good c such as Ag, Cu, Al, Mo/Al/Mo laminate layers, Ti/Al/Ti laminate layers, or Mo/Cu laminate layers, etc.

The manufacturing method of the photo sensor of this embodiment, through respectively implanting phosphorus ions to form an N-type region and implanting boron ions to form a P-type region on a surface of a same layer of polycrystalline silicon by an ion implantation method, is compatible with an ion implantation process and does not need to add borane gas and phosphane gas. Furthermore, covering a layer of an amorphous silicon photosensitive layer on the polycrystalline silicon enhances light absorption ability and can increase photo-generated electron-hole pairs. Furthermore, built-in electric fields exist on a horizontal direction and a vertical direction, which can more effectively separate the electron-hole pairs to enhance photo-generated electric current to improve accuracy of fingerprint recognition.

The present disclosure further provides a photo sensor manufactured by the manufacturing method mentioned above. Please refer to FIG. 4A to FIG. 4B, FIG. 4A is a photo sensing schematic diagram of the photo sensor of the present disclosure, and as a comparison, FIG. 4B is a photo sensing schematic diagram of a photo sensor in the prior art.

Figure 4A:
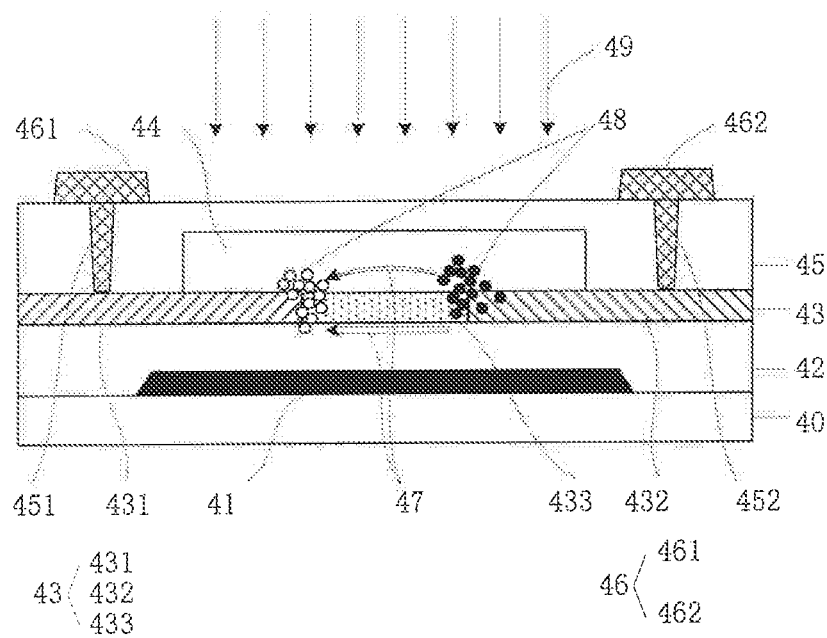
FIG. 4A is a photo sensing schematic diagram of the photo sensor of the present disclosure.
Figure 4B:
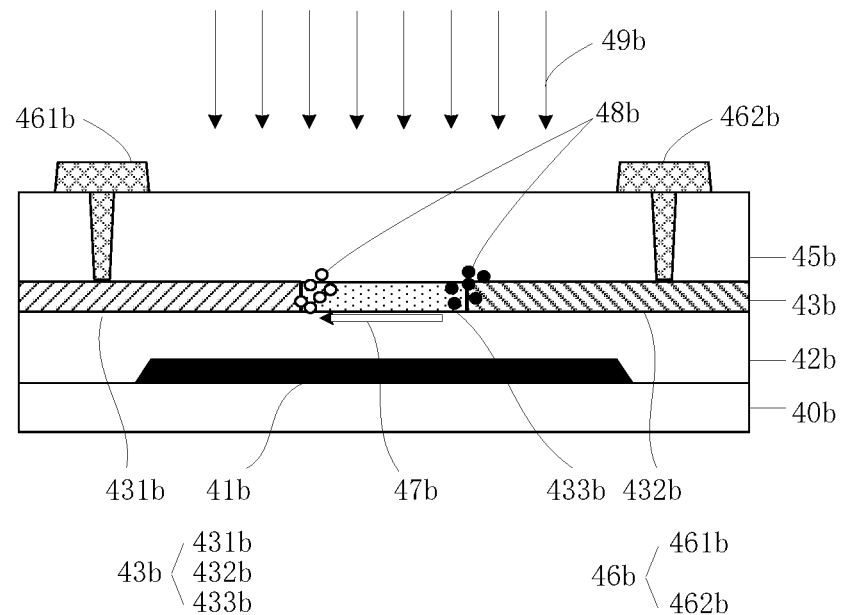
FIG. 4B is a photo sensing schematic diagram of a photo sensor in the prior art.

As illustrated in FIG. 4A, the photo sensor of the present disclosure includes a first insulation layer, a semiconductor layer 43, a photosensitive layer 44, a second insulation layer 45, and an electrode layer 46.

Specifically, the first insulation layer includes a light shielding layer 41 and a buffer layer 42. The light shielding layer 41 is disposed on a base substrate 40, The light shielding layer 41 is a single-layer structure or a laminated structure made of a non-light-transmissive material. The non-light-transmissive material can be Mo, Ti, a Mo/Al laminated layer, a Ti/Al laminated layer, etc. The buffer layer 42 is disposed on the base substrate 40 and covers the light shielding layer 41. SiOx, SiNx, or SiOxNy can be used as a material of the buffer layer 42, and a SiOx/SiNx laminated structure can also be used.

Specifically, the semiconductor layer 43 includes a P-type region 431, an I-type region 433, and an N-type region 432 sequentially disposed on the first insulation layer along a transverse direction. In a further embodiment, boron ions or indium ions are doped in the P-type region 431, phosphorus ions or antimony ions are doped in the N-type region 432, and a material of the I-type region 433 is an intrinsic amorphous silicon or polycrystalline silicon. The P-type region 431 and the N-type region 432 are formed by an ion implantation method, which can be compatible with an ion implantation process of LTPS production line process and does not need to add borane gas and phosphane gas to manufacture different layers additionally.

Specifically, the photosensitive layer 44 covers the I-type region 433 and extends to the P-type region 431 and the N-type region 432 respectively. In a further embodiment, a material of the photosensitive layer 44 is intrinsic amorphous silicon, and a layer thickness of the photosensitive layer 44 is greater than or equal to 2000 angstroms, which can ensure sufficient absorption of reflected light from fingers and increases photo-generated electron-hole pairs.

Specifically, the second insulation layer 45 covers the photosensitive layer 44, and the second insulation layer 45 has a first connection hole 451 in a region corresponding to the P-type region 431 and a second connection hole 452 in a region corresponding to the N-type region 432. SiOx, SiNx, or SiOxNy can be used as a material of the second insulation layer 45, and a SiOx/SiNx laminated structure can also be used.

Specifically, the electrode layer 46 includes a first electrode 461 and a second electrode 462 disposed on the second insulation layer 45. The first electrode 461 is connected to the P-type region 431 through the first connection hole 451, and the second electrode 462 is connected to the N-type region 432 through the second connection hole 452.

The photo sensor of the present disclosure can be compatible with an ion implantation process of LTPS production line process and does not need to add borane gas and phosphane gas to manufacture different layers additionally. By covering a layer of an intrinsic a-Si photosensitive layer on the PIN-type diodes of a horizontal structure, sufficient absorption of reflected light 49 from fingers can be ensured and photo-generated electron-hole pairs 48 can be increased, and built-in electric fields (a black arrow 47 in FIG. 4A referring to a direction of the built-in electric field of the present disclosure) can exist on a horizontal direction and a vertical direction, which can more effectively separate the electron-hole pairs to enhance photo-generated electric current to improve accuracy of fingerprint recognition. The photo sensor of the present disclosure can be used in liquid crystal display (LCD) panels or under organic light emitting diode (OLED) panels to perform optical fingerprint recognition.

As illustrated in FIG. 4B, a photo sensor in the prior art includes a light shielding layer 41b, a buffer layer 42b, a semiconductor layer 43b, a P-type region 431b, an I-type region 433b, and an N-type region 432b which are disposed on a base substrate 40b, a second insulation layer 45b, and an electrode layer 46b. The semiconductor layer 43b includes a P-type region 431b, an I-type region 433b, and an N-type region 432b sequentially disposed along a transverse direction. The electrode layer 46b includes a first electrode 461b and a second electrode 462b. Regarding current PIN-type diode devices of full polycrystalline silicon (Poly-Si) horizontal structures manufactured by using the ion implantation, because a crystallization thickness of polycrystalline silicon is limited by an excimer laser annealing (ELA) process, optoelectronic response of the reflected light 49b from fingers is relatively low, photo-generated electron-hole pairs 48b are relatively less, and a built-in electric field only exists on a horizontal direction (a black arrow 47b in FIG. 4B referring to a direction of the built-in electric field of the present disclosure), thereby making integrated circuits (ICs) unable to read signals accurately, and affecting accuracy of fingerprint recognition.

Figure 5:
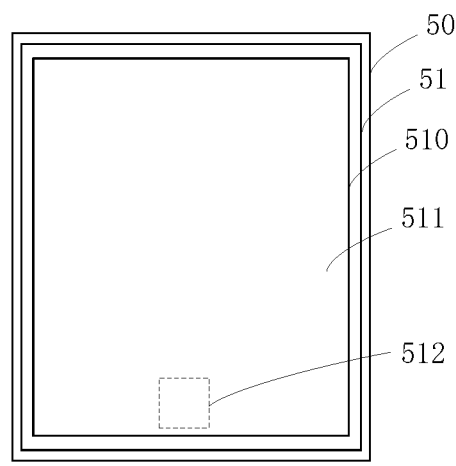
FIG. 5 is a structural schematic diagram of a display panel of the present disclosure.

On the basis of the same invention construct, the present disclosure further provides a display panel, Please refer to FIG. 5, which is a structural schematic diagram of a display panel of the present disclosure. The display panel 50 of the present disclosure includes an array substrate 51. The array substrate 51 includes a base substrate 510, a thin film transistor layer 511 disposed on the base substrate, and at least one photo sensor 512 disposed on the base substrate 510 (the position is indicated by a dotted line frame). Furthermore, the photo sensor mentioned above in the present disclosure is used as the photo sensor to perform optical fingerprint recognition. The manufacturing method, the structure, and the advantages of the photo sensor 512 have been described in detail above, and redundant description will not be mentioned herein again.

The display panel 50 can be an LCD display panel or an OLED display panel, which uses the photo sensor of the present disclosure to perform optical fingerprint recognition and has better accuracy of fingerprint recognition.

It can be understood, that for those of ordinary skill in the art, various other corresponding changes and modifications can be made according to the technical solutions and technical ideas of the present disclosure, and all such changes and modifications are intended to fall within the scope of protection of the claims of the present disclosure.

What is claimed is:

1. A manufacturing method on a photo sensor, comprising following steps:
   forming a first insulation layer on a base substrate;
   forming a polycrystalline silicon layer on the first insulation layer, and performing a patterning process on the polycrystalline silicon layer to form a first region, a second region, and a third region between the first region and the second region;
   using an ion implantation method to dope a plurality of first ions in the first region of the polycrystalline silicon layer to form a P-type region and to dope a plurality of second ions in the second region of the polycrystalline silicon layer to form an N-type region;
   forming a photosensitive layer on the polycrystalline silicon layer, wherein the photosensitive layer covers the third region and extends to the P-type region and the N-type region respectively, the third region forms an I-type region, a material of the photosensitive layer is intrinsic amorphous silicon, a layer thickness of the photosensitive layer is greater than or equal to 2000 angstroms, the layer thickness of the photosensitive layer is uniform, and the photosensitive layer absorbs light;
   forming a second insulation layer on the photosensitive layer, and on the second insulation layer, forming a first connection hole in a region corresponding to the P-type region and forming a second connection hole in a region corresponding to the N-type region, wherein a top surface of the photosensitive layer directly contacts the second insulation layer; and
   forming an electrode layer on the second insulation layer, wherein the electrode layer comprises a first electrode and a second electrode, the first electrode is connected to the P-type region through the first connection hole, and the second electrode is connected to the N-type region through the second connection hole.

2. The manufacturing method as claimed in claim 1, wherein the step of forming the first insulation layer on the base substrate comprises:
   depositing a non-light-transmissive material on the base substrate and performing a patterning process to form a light shielding layer, wherein the light shielding layer partially covers the base substrate; and
   forming a buffer layer on the light shielding layer, wherein the buffer layer covers the light shielding layer and the base substrate.

3. The manufacturing method as claimed in claim 1, wherein ion implantations of the plurality of first ions and the plurality of second ions are performed by two photomask processes respectively.

4. The manufacturing method as claimed in claim 1, wherein the plurality of first ions are boron ions or indium ions, and the plurality of second ions are phosphorus ions or antimony ions.

5. The manufacturing method as claimed in claim 1, wherein
   the third region formed in the step of performing the patterning process on the polycrystalline silicon layer to form the first region, the second region, and the third region between the first region and the second region is a blank region; and
   a material of forming the photosensitive layer in the step of forming the photosensitive layer on the polycrystalline silicon layer is filled in the third region to form the I-type region from the third region.

6. The manufacturing method as claimed in claim 1, wherein the third region formed in the step of performing the patterning process on the polycrystalline silicon layer to form the first region, the second region, and the third region between the first region and the second region is a polycrystalline silicon region, and the polycrystalline silicon region acts as the I-type region.

7. A photo sensor, comprising:
a first insulation layer disposed on a base substrate;
a semiconductor layer, wherein the semiconductor layer comprises a P-type region, an I-type region, and an N-type region sequentially disposed on the first insulation layer along a transverse direction;
a photosensitive layer covering the I-type region and extending to the P-type region and the N-type region respectively, wherein a material of the photosensitive layer is intrinsic amorphous silicon, a layer thickness of the photosensitive layer is greater than or equal to 2000 angstroms, the layer thickness of the photosensitive layer is uniform, and the photosensitive layer absorbs light;
a second insulation layer covering the photosensitive layer, wherein the second insulation layer comprises a first connection hole in a region corresponding to the P-type region and a second connection hole in a region corresponding to the N-type region, and a top surface of the photosensitive layer directly contacts the second insulation layer; and
an electrode layer disposed on the second insulation layer, wherein the electrode layer comprises a first electrode and a second electrode, the first electrode is connected to the P-type region through the first connection hole, and the second electrode is connected to the N-type region through the second connection hole.

8. The photo sensor as claimed in claim 7, wherein the first insulation layer comprises:
a light shielding layer disposed on the base substrate, wherein the light shielding layer is a single-layer structure or a laminated structure made of a non-light-transmissive material; and
a buffer layer disposed on the base substrate and covering the light shielding layer.

9. The photo sensor as claimed in claim 8, wherein the buffer layer is a silica/silicon nitride laminated structure.

10. The photo sensor as claimed in claim 7, wherein a material of the second insulation layer is silica, silicon nitride, or silicon oxynitride.

11. The photo sensor as claimed in claim 7, wherein the second insulation layer is a silica/silicon nitride laminated structure.

12. The photo sensor as claimed in claim 7, wherein a material of the I-type region is an intrinsic amorphous silicon or polycrystalline silicon.

13. A display panel, comprising an array substrate, wherein the array substrate comprises:
a base substrate;
a thin film transistor layer disposed on the base substrate; and
at least one photo sensor disposed on the base substrate, wherein the photo sensor is the photo sensor as claimed in claim 7.

* * * * *